(12) United States Patent
Kumar

(10) Patent No.: US 8,981,973 B2
(45) Date of Patent: Mar. 17, 2015

(54) SUCCESSIVE-APPROXIMATION-REGISTER (SAR) ANALOG-TO-DIGITAL CONVERTER (ADC) ATTENUATION CAPACITOR CALIBRATION METHOD AND APPARATUS

(71) Applicant: Microchip Technology Incorporated, Chandler, AZ (US)

(72) Inventor: Ajay Kumar, Phoenix, AZ (US)

(73) Assignee: Microchip Technology Incorporated, Chandler, AZ (US)

( * ) Notice: Subject to any disclaimer, the term of this patent is extended or adjusted under 35 U.S.C. 154(b) by 0 days.

(21) Appl. No.: 14/197,951

(22) Filed: Mar. 5, 2014

(65) Prior Publication Data

US 2014/0253351 A1    Sep. 11, 2014

Related U.S. Application Data

(60) Provisional application No. 61/775,326, filed on Mar. 8, 2013.

(51) Int. Cl.
| | |
|---|---|
| *H03M 1/06* | (2006.01) |
| *H03M 1/10* | (2006.01) |
| *H03M 1/46* | (2006.01) |
| *H03M 1/68* | (2006.01) |
| *H03M 1/80* | (2006.01) |

(52) U.S. Cl.
CPC .......... *H03M 1/0617* (2013.01); *H03M 1/1061* (2013.01); *H03M 1/468* (2013.01); *H03M 1/68* (2013.01); *H03M 1/804* (2013.01)
USPC .......................................... 341/118; 341/163

(58) Field of Classification Search
CPC ... H03M 1/0617; H03M 1/1061; H03M 1/68; H03M 1/804
USPC ................ 341/155, 144, 163, 118, 120
See application file for complete search history.

(56) References Cited

U.S. PATENT DOCUMENTS

| | | | |
|---|---|---|---|
| 6,707,403 B1 * | 3/2004 | Hurrell ......................... | 341/120 |
| 7,903,018 B2 * | 3/2011 | Schatzberger et al. ....... | 341/172 |
| 8,446,304 B2 * | 5/2013 | Scanlan ....................... | 341/120 |
| 8,665,125 B2 * | 3/2014 | Reinhold et al. ............. | 341/120 |
| 2011/0215956 A1 | 9/2011 | Ishikawa ...................... | 341/110 |
| 2011/0234433 A1 | 9/2011 | Aruga et al. ................. | 341/172 |

FOREIGN PATENT DOCUMENTS

WO    2009/108391 A1    9/2009    .............. H03M 1/80

OTHER PUBLICATIONS

International Search Report and Written Opinion, Application No. PCT/US2014/021008, 11 pages, Jun. 25, 2014.

\* cited by examiner

*Primary Examiner* — Peguy Jean Pierre
(74) *Attorney, Agent, or Firm* — King & Spalding L.L.P.

(57) ABSTRACT

A fixed capacitor is coupled between a top plate of an attenuation capacitor and a variable voltage reference. The error in the attenuation capacitor may be calibrated out with the variable voltage reference and the fixed correction capacitor. The variable voltage reference varies the charge on the attenuation capacitor and thereby compensates for error(s) therein. A calibration digital-to-analog converter may be used in conjunction with or substituted for the variable voltage reference, and may be programmed for different charge compensation values from the SAR logic during an iterative SAR DAC capacitive switching process.

23 Claims, 3 Drawing Sheets

Figure 1 (Prior Technology)

Figure 2 (Prior Technology)

000
SUCCESSIVE-APPROXIMATION-REGISTER (SAR) ANALOG-TO-DIGITAL CONVERTER (ADC) ATTENUATION CAPACITOR CALIBRATION METHOD AND APPARATUS

RELATED PATENT APPLICATION

This application claims priority to commonly owned U.S. Provisional Patent Application No. 61/775,326; filed Mar. 8, 2013; which is hereby incorporated by reference herein for all purposes.

TECHNICAL FIELD

The present disclosure relates to successive-approximation-register (SAR) analog-to-digital converters (ADCs), and, more particularly, to calibration of an attenuation capacitor in the SAR DAC.

BACKGROUND

Successive-approximation-register (SAR) analog-to-digital converters (ADCs) are frequently the architecture of choice for medium-to-high-resolution applications with medium to high sample rates. Resolutions for SAR ADCs most commonly range from 8 to 16 bits, and they provide low power consumption as well as a small form factor. This combination of features make these ADCs ideal for a wide variety of applications, such as portable/battery-powered instruments, pen digitizers, industrial controls, and data/signal acquisition. As the name implies, the SAR ADC basically implements a binary search algorithm. Therefore, while the internal circuitry may be running at several megahertz (MHz), the ADC sample rate is a fraction of that number due to the successive-approximation algorithm.

An attenuation capacitor (Ca) may be used between two capacitive DACs inside of a SAR ADC to reduce the range of capacitance values required. One side of the attenuation capacitor (Ca) is coupled to the most significant bit (msb) DAC (mDAC) and the other side of the attenuation capacitor (Ca) is coupled to a lower bit DAC (nDAC). The absolute value of the attenuation capacitor (Ca) depends on the values of the unit capacitors in the DACs ratio between the bottom plate parasitic of the unit capacitor and the top-plate parasitic capacitance of the lower bit DAC capacitors. It is critical to have the attenuation capacitor (Ca) capacitance manufactured to a tolerance of better than 0.25 percent accuracy with respect to the mDAC unit capacitor. Since the attenuation capacitor (Ca) depends on parasitic capacitance in an integrated circuit silicon die on which it is fabricated, this close accuracy has been achieved with prior technologies in two ways: (1) Silicon iteration based on measurement data to correct the parasitic capacitance value and then re-fabricate the silicon die of the SAR DAC (FIG. 1), and (2) use of a varactor (voltage variable capacitor) (FIG. 2), that introduces its own variable parasitic capacitance with respect to process and temperature variations.

Referring to FIG. 1, depicted is a schematic diagram of a typical prior technology split capacitive SAR DAC having an attenuation capacitor ($C_A$) between an mDAC and an nDAC thereof. A problem exists for fine tuning of the attenuation capacitor ($C_A$) of a SAR DAC using the silicon iteration based process prior technology method (1). The value of $C_A$ with no parasitic capacitance present is:

$$C_A = \frac{2^N}{2^N - \alpha} C_U$$

Where α is the ratio between unit capacitors of mDAC and nDAC. The value of $C_A$ with parasitic capacitance present is:

$$C_A = \frac{2^N \lambda}{2^N \lambda - \alpha} C_U$$

Where λ is a parasitic dependent factor. For example, a 5C-5C-2R implementation of the SAR DAC may have parasitic top-plate routing and a bottom plate of $C_A$, wherein $C_A$ is approximately 107.204% of Cu, for Cu=150 femtofarads (fF) and $C_A$=160.8 fF. A one percent (1%) error (1.6 fF) in $C_A$ results in about 0.3 DNL or about 3% error of 1 DNL. The total expected routing capacitor=60 fF. $C_A$ may be calculated from the parasitic capacitance, but it is impossible to get the correct capacitance needed the first time.

Referring to FIG. 2, depicted is a schematic diagram of a typical prior technology split capacitive DAC having an attenuation capacitor (Ca) between an mDAC and an nDAC thereof and a voltage variable capacitor compensation circuit. The prior technology method (2) using a fixed voltage reference ($V_{REF}$), a compensation DAC (cDAC) 210 for controlling a voltage variable capacitor (varactor) 212 has a big capacitance variation across a range of process, voltage and temperature (PVT) conditions. The varactor is added to correct the parasitic variations of the attenuation capacitor (Ca) but adds much bigger capacitance variation by itself, e.g., the varactor adds parasitic capacitance to the top-plate of the nDAC. Use of the varactor 212 may result in performance variations and differential nonlinearity (DNL) sensitivity across a range PVT conditions.

SUMMARY

Therefore, a need exists for a way to more easily calibrate an attenuation capacitor in a SAR DAC, and that this calibration remains stable across a wide range of process, voltage and temperature (PVT) conditions.

According to an embodiment, an apparatus for calibrating a successive-approximation register (SAR) analog-to-digital converter (ADC) may comprise: a most significant bit digital-to-analog converter (mDAC) comprising a plurality of binary weighted first capacitors; a lower bit digital-to-analog converter (nDAC) comprising a plurality of binary weighted second capacitors; an attenuation capacitor coupled between the mDAC and the nDAC; a correction capacitor having a fixed capacitance value, wherein the correction capacitor may be coupled to the attenuation capacitor; and a variable voltage reference may be coupled to the fixed value capacitor; wherein a voltage from the variable voltage reference may be adjusted to vary a charge on the correction capacitor for compensating a capacitance value error of the attenuation capacitor.

According to a further embodiment, a first plate of the correction capacitor may be coupled to the attenuation capacitor and a second plate of the correction capacitor may be coupled to the variable voltage reference. According to a further embodiment, the correction capacitor and the plurality of binary weighted second capacitors may be fixed value metal-insulator-metal (MIM) capacitors. According to a further embodiment, the correction capacitor and the plurality of binary weighted second capacitors may be fixed value metaloxide-metal (MOM) capacitors. According to a further embodiment, adjustment of the variable voltage reference may be programmable. According to a further embodiment, the programmable variable voltage reference may be programmed from a successive approximation register (SAR). According to a further embodiment, the SAR controls which of the plurality of binary weighted first and second capacitors may be selected during an analog-to-digital conversion by the SAR DAC. According to a further embodiment, the programmable variable voltage reference may be programmed from the SAR for a plurality of different charges on the correction capacitor to compensate for a plurality of different capacitance value errors of the attenuation capacitor. According to a further embodiment, which one of the plurality of different charges on the correction capacitor may be programmed depends upon which ones of the plurality of binary weighted first and second capacitors may be selected by the SAR.

According to another embodiment, an apparatus for calibrating a successive-approximation register (SAR) analog-to-digital converter (DAC) may comprise: a most significant bit digital-to-analog converter (mDAC) comprising a plurality of binary weighted first capacitors; a lower bit digital-to-analog converter (nDAC) comprising a plurality of binary weighted second capacitors; an attenuation capacitor coupled between the mDAC and the nDAC; a correction capacitor having a fixed capacitance value, wherein the correction capacitor may be coupled to the attenuation capacitor; and a calibration digital-to-analog converter (cDAC) coupled to the fixed value capacitor; wherein a voltage from the cDAC may be programmed to vary a charge on the correction capacitor for compensating a capacitance value error of the attenuation capacitor.

According to a further embodiment, a first plate of the correction capacitor may be coupled to the attenuation capacitor and a second plate of the correction capacitor may be coupled to the cDAC. According to a further embodiment, the correction capacitor and the plurality of binary weighted second capacitors may be fixed value metal-insulator-metal (MIM) capacitors. According to a further embodiment, the correction capacitor and the plurality of binary weighted second capacitors may be fixed value metal-oxide-metal (MOM) capacitors. According to a further embodiment, the cDAC may be programmed from a successive approximation register (SAR). According to a further embodiment, the SAR controls which of the plurality of binary weighted first and second capacitors may be selected during an analog-to-digital conversion by the SAR DAC. According to a further embodiment, a voltage reference may be coupled to the cDAC. According to a further embodiment, the voltage reference may be programmable. According to a further embodiment, the programmable variable voltage reference may be programmed from the SAR. According to a further embodiment, the programmable variable voltage reference may be programmed from the SAR for a plurality of different charges on the correction capacitor. According to a further embodiment, which one of the plurality of different charges on the correction capacitor may be programmed depends upon which ones of the plurality of binary weighted first and second capacitors may be selected by the SAR.

According to yet another embodiment, a method for calibrating a successive-approximation register (SAR) analog-to-digital converter (DAC) may comprise the steps of: providing a most significant bit digital-to-analog converter (mDAC) comprising a plurality of binary weighted first capacitors; providing a lower bit digital-to-analog converter (nDAC) comprising a plurality of binary weighted second capacitors; providing an attenuation capacitor coupled between the mDAC and the nDAC; providing a correction capacitor having a fixed capacitance value, wherein the correction capacitor may be coupled to the attenuation capacitor; and varying a voltage on the correction capacitor to compensate for a capacitance value error of the attenuation capacitor.

According to a further embodiment of the method, the variable voltage may be from a variable voltage reference. According to a further embodiment of the method, the variable voltage may be from a calibration digital-to-analog converter (cDAC).

BRIEF DESCRIPTION OF THE DRAWINGS

A more complete understanding of the present disclosure may be acquired by referring to the following description taken in conjunction with the accompanying drawings wherein.

Figure 1:
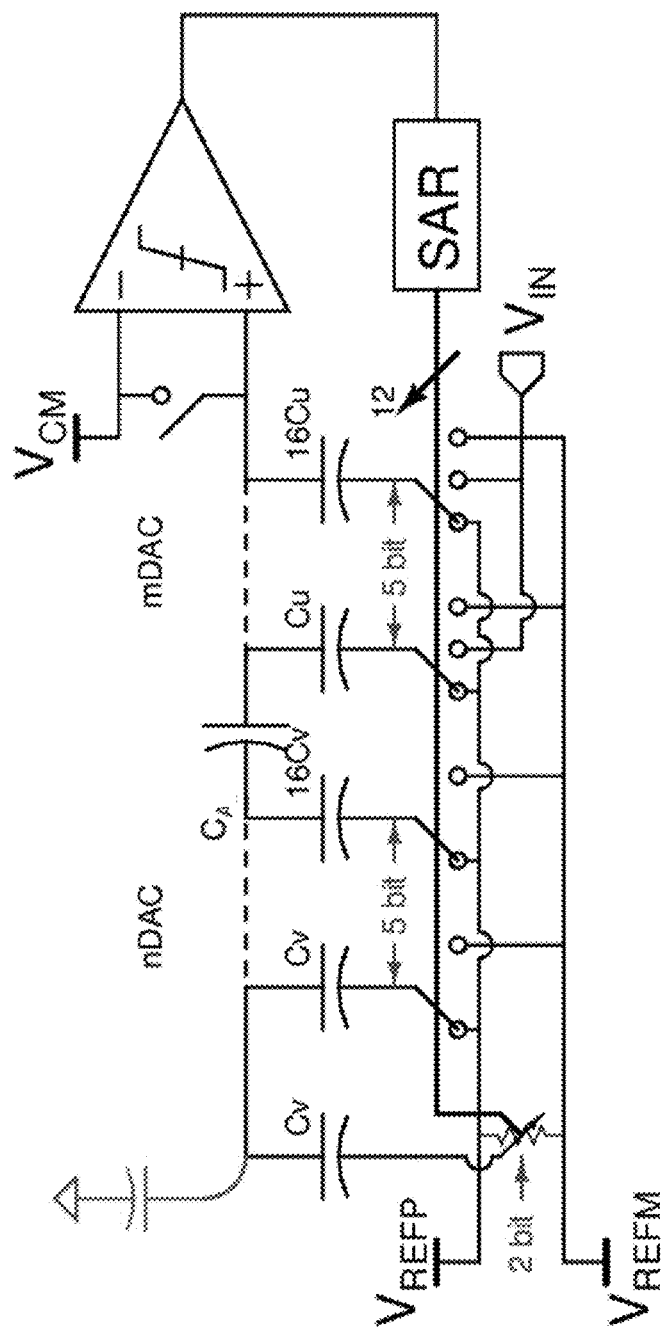
FIG. 1 illustrates a schematic diagram of a typical prior technology split capacitive DAC having an attenuation capacitor (Ca) between an mDAC and an nDAC thereof.
Figure 2:
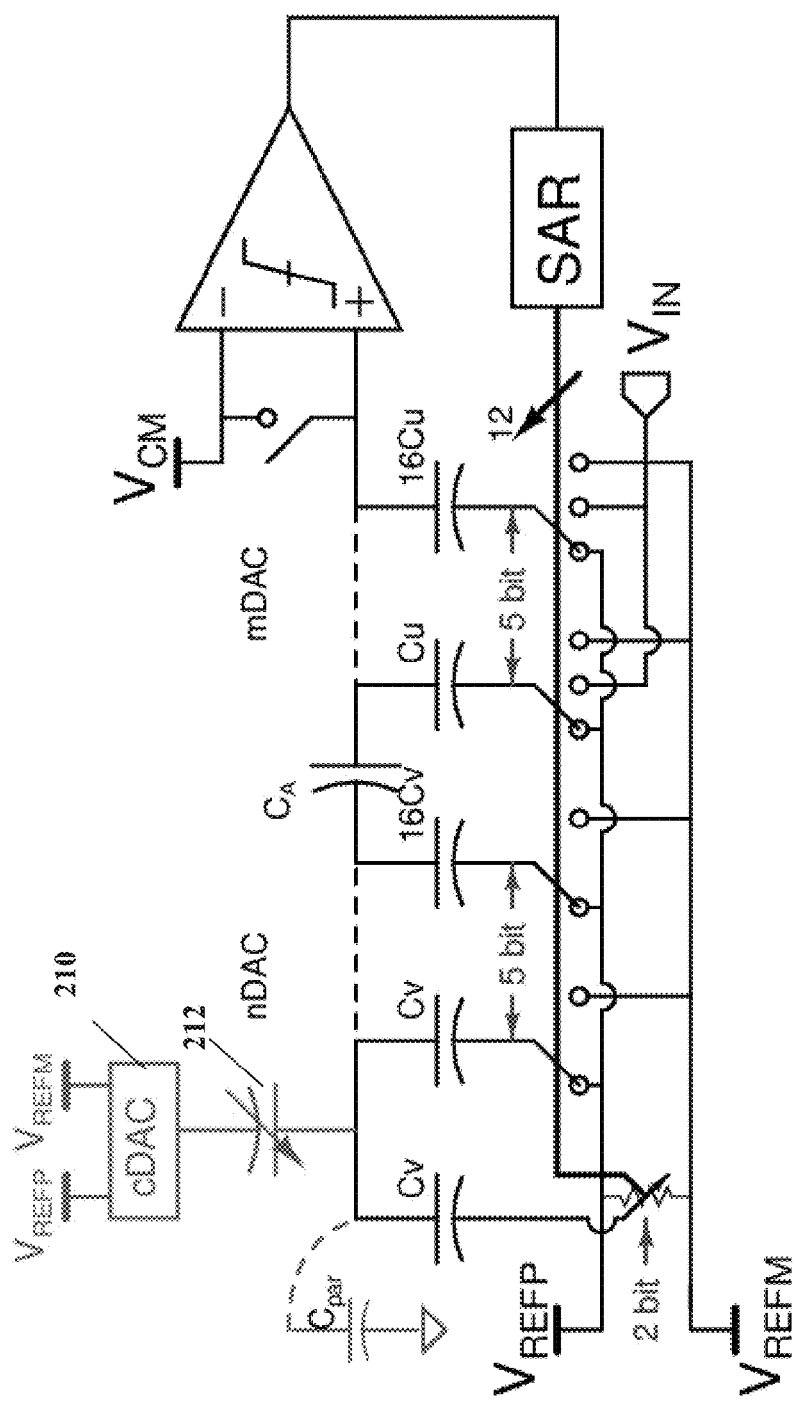
FIG. 2 illustrates a schematic diagram of a typical prior technology split capacitive DAC having an attenuation capacitor (Ca) between an mDAC and an nDAC thereof and a voltage variable capacitor compensation circuit.

While the present disclosure is susceptible to various modifications and alternative forms, specific example embodiments thereof have been shown in the drawings and are herein described in detail. It should be understood, however, that the description herein of specific example embodiments is not intended to limit the disclosure to the particular forms disclosed herein, but on the contrary, this disclosure is to cover all modifications and equivalents as defined by the appended claims.

DETAILED DESCRIPTION

According to various embodiments, the error in the attenuation capacitor (Ca) may be calibrated out using a variable voltage reference and a fixed value correction capacitor, thereby adding another unit element to the nDAC. An advantage is that the nDAC elements are either a metal-insulator-metal (MIM) capacitor or a metal-oxide-metal (MOM) capacitor, wherein these types of capacitors have fixed capacitance values and the parasitic capacitance is on the bottom plates thereof. In addition to adding another unit element to the nDAC another calibration DAC (cDAC) may be coupled to the negative side of the unit element added to the nDAC. The cDAC may either have the same number of elements as the nDAC or may be shorter. The DNL error of an nDAC is prominent in the first few MSB elements. Therefore, having a 2 to 3 bit deep calibration cDAC will be sufficient to correct for the error in the attenuation capacitor (Ca). The cDAC receives the same controlled signal and is structured in a similar fashion as the nDAC. Therefore, when the elements of the nDAC transfer the charge to the top plate of the nDAC, the elements of the cDAC will do the same. Hence, the charge transfer for an $i^{th}$ bit element will be:

$$nDACi*Vref+cDACi*Vref\_var.$$

By calibrating the reference voltage, Vref_var, going only to the cDAC, a correction may be made for the error in the attenuation capacitor (Ca).

According to various embodiments, for correct SAR operation, the change

"sum of (nDACi*Vref+cDACi*Vref_var)"

will result in a least significant bit (LSB) charge change in the mDAC. Therefore, by using a fixed capacitance and a variable reference voltage, calibration of a SAR DAC will be more robust and will have very little variation due to PVT.

Referring now to the drawings, the details of specific example embodiments are schematically illustrated. Like elements in the drawings will be represented by like numbers, and similar elements will be represented by like numbers with a different lower case letter suffix.

Figure 3:
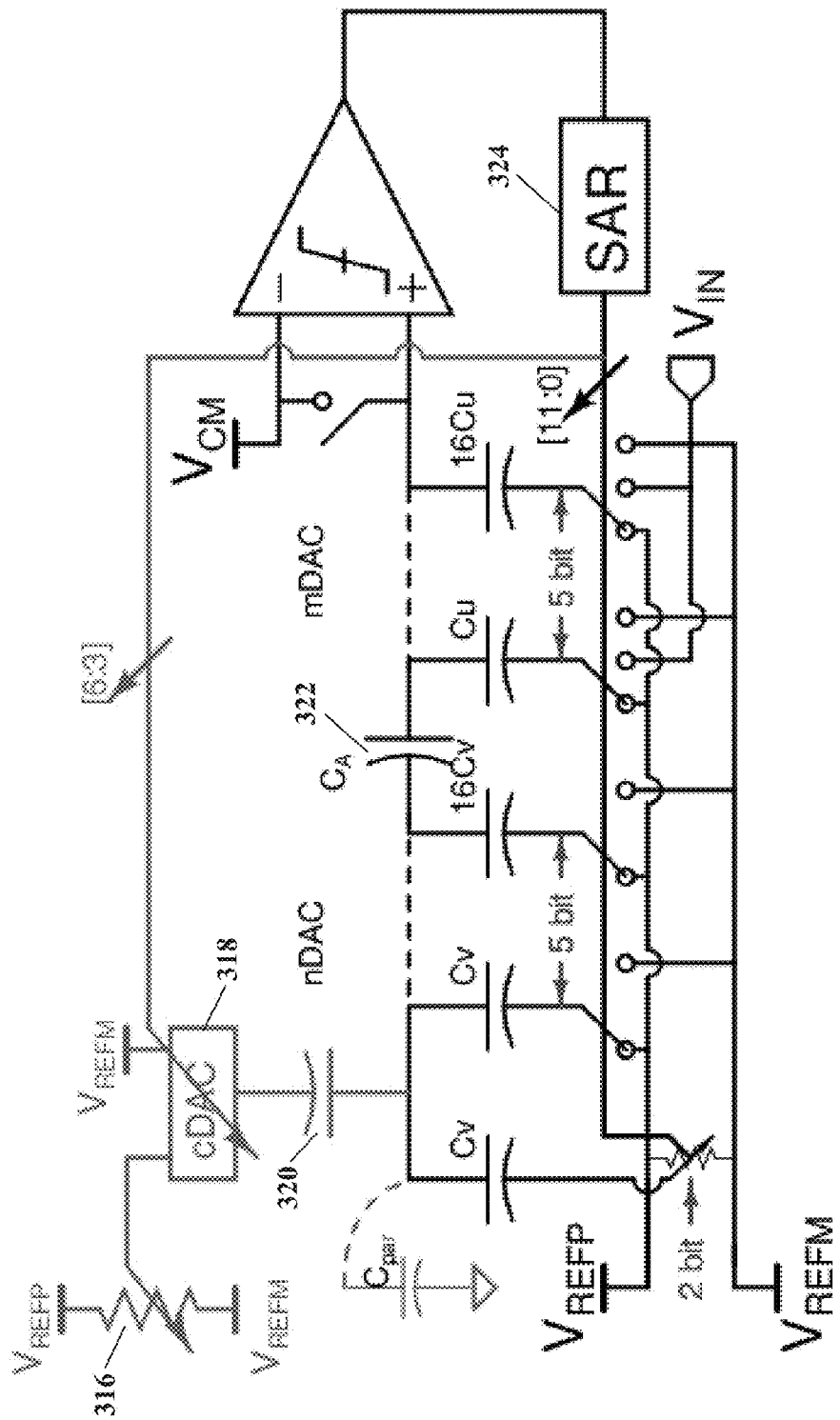
FIG. 3 illustrates a schematic diagram of a split capacitive DAC having an attenuation capacitor (Ca) between an mDAC and an nDAC thereof, and a fixed capacitance and a variable reference voltage, according to a specific example embodiment of this disclosure.

Referring to FIG. 3, depicted is a schematic diagram of a split capacitive DAC having an attenuation capacitor (Ca) between an mDAC and an nDAC thereof, and a fixed capacitance and a variable voltage reference, according to a specific example embodiment of this disclosure. A fixed value capacitor 320 may be coupled between a top plate of an attenuation capacitor (Ca) 322 and a variable voltage reference 316. The variable voltage reference 316 may vary the charge on the fixed value capacitor 320 and thereby compensate for error(s) in the attenuation capacitor (Ca) 322. The calibration DAC (cDAC) 318 may be used in conjunction with or substituted for the variable voltage reference 316, and may be programmed for different charge compensation values from the SAR logic 324 during the iterative SAR DAC capacitive switching process.

For example, a variable voltage reference 316 and/or a calibration DAC (cDAC) 318 may be used, according to a specific example embodiment of this disclosure. For example: When $C_A$=160.89 fF, it has to be accurate down to 1 fF. By using, for example but not limited to, a fixed MOM capacitor and a variable reference voltage, VREFM, a 4 bit cDAC may be controlled from the same code as the nDAC [6:3], and an error of up to ±0.3% (programmable) may be correctable when using a 0.02 percent step size.

| CA_err | DNL | Vcal |
|---|---|---|
| 1 | 0.296006 | 4.736102 |
| 2 | 0.592485 | 9.479768 |
| 3 | 0.889438 | 14.231 |
| 0.1 | 0.029579 | 0.47327 |
| 0.2 | 0.059164 | 0.946616 |
| 0.3 | 0.088752 | 1.420037 |

While embodiments of this disclosure have been depicted, described, and are defined by reference to example embodiments of the disclosure, such references do not imply a limitation on the disclosure, and no such limitation is to be inferred. The subject matter disclosed is capable of considerable modification, alteration, and equivalents in form and function, as will occur to those ordinarily skilled in the pertinent art and having the benefit of this disclosure. The depicted and described embodiments of this disclosure are examples only, and are not exhaustive of the scope of the disclosure.

What is claimed is:

1. An apparatus for calibrating a successive-approximation register (SAR) analog-to-digital converter (ADC), comprising:
   a most significant bit digital-to-analog converter (mDAC) comprising a plurality of binary weighted first capacitors;
   a lower bit digital-to-analog converter (nDAC) comprising a plurality of binary weighted second capacitors;
   an attenuation capacitor coupled between the mDAC and the nDAC;
   a correction capacitor having a fixed capacitance value, wherein the correction capacitor is coupled to the attenuation capacitor; and
   a variable voltage reference is coupled to the fixed value capacitor;
   wherein a voltage from the variable voltage reference is adjusted to vary a charge on the correction capacitor for compensating a capacitance value error of the attenuation capacitor.

2. The apparatus according to claim 1, wherein a first plate of the correction capacitor is coupled to the attenuation capacitor and a second plate of the correction capacitor is coupled to the variable voltage reference.

3. The apparatus according to claim 1, wherein the correction capacitor and the plurality of binary weighted second capacitors are fixed value metal-insulator-metal (MIM) capacitors.

4. The apparatus according to claim 1, wherein the correction capacitor and the plurality of binary weighted second capacitors are fixed value metal-oxide-metal (MOM) capacitors.

5. The apparatus according to claim 1, wherein adjustment of the variable voltage reference is programmable.

6. The apparatus according to claim 5, wherein the programmable variable voltage reference is programmed from a successive approximation register (SAR).

7. The apparatus according to claim 6, wherein the SAR controls which of the plurality of binary weighted first and second capacitors are selected during an analog-to-digital conversion by the SAR DAC.

8. The apparatus according to claim 5, wherein the programmable variable voltage reference is programmed from the SAR for a plurality of different charges on the correction capacitor to compensate for a plurality of different capacitance value errors of the attenuation capacitor.

9. The apparatus according to claim 8, wherein which one of the plurality of different charges on the correction capacitor is programmed depends upon which ones of the plurality of binary weighted first and second capacitors are selected by the SAR.

10. An apparatus for calibrating a successive-approximation register (SAR) analog-to-digital converter (DAC), comprising:
    a most significant bit digital-to-analog converter (mDAC) comprising a plurality of binary weighted first capacitors;
    a lower bit digital-to-analog converter (nDAC) comprising a plurality of binary weighted second capacitors;
    an attenuation capacitor coupled between the mDAC and the nDAC;
    a correction capacitor having a fixed capacitance value, wherein the correction capacitor is coupled to the attenuation capacitor; and
    a calibration digital-to-analog converter (cDAC) coupled to the fixed value capacitor;
    wherein a voltage from the cDAC is programmed to vary a charge on the correction capacitor for compensating a capacitance value error of the attenuation capacitor.

11. The apparatus according to claim 10, wherein a first plate of the correction capacitor is coupled to the attenuation capacitor and a second plate of the correction capacitor is coupled to the cDAC.

12. The apparatus according to claim 10, wherein the correction capacitor and the plurality of binary weighted second capacitors are fixed value metal-insulator-metal (MIM) capacitors.

13. The apparatus according to claim 10, wherein the correction capacitor and the plurality of binary weighted second capacitors are fixed value metal-oxide-metal (MOM) capacitors.

14. The apparatus according to claim 10, wherein the cDAC is programmed from a successive approximation register (SAR).

15. The apparatus according to claim 14, wherein the SAR controls which of the plurality of binary weighted first and second capacitors are selected during an analog-to-digital conversion by the SAR DAC.

16. The apparatus according to claim 14, further comprising a voltage reference coupled to the cDAC.

17. The apparatus according to claim 16, wherein the voltage reference is programmable.

18. The apparatus according to claim 17, wherein the programmable variable voltage reference is programmed from the SAR.

19. The apparatus according to claim 18, wherein the programmable variable voltage reference is programmed from the SAR for a plurality of different charges on the correction capacitor.

20. The apparatus according to claim 19, wherein which one of the plurality of different charges on the correction capacitor is programmed depends upon which ones of the plurality of binary weighted first and second capacitors are selected by the SAR.

21. A method for calibrating a successive-approximation register (SAR) analog-to-digital converter (DAC), said method comprising the steps of:
    providing a most significant bit digital-to-analog converter (mDAC) comprising a plurality of binary weighted first capacitors;
    providing a lower bit digital-to-analog converter (nDAC) comprising a plurality of binary weighted second capacitors;
    providing an attenuation capacitor coupled between the mDAC and the nDAC;
    providing a correction capacitor having a fixed capacitance value, wherein the correction capacitor is coupled to the attenuation capacitor; and
    varying a voltage on the correction capacitor to compensate for a capacitance value error of the attenuation capacitor.

22. The method according to claim 21, wherein the variable voltage is from a variable voltage reference.

23. The method according to claim 21, wherein the variable voltage is from a calibration digital-to-analog converter (cDAC).

* * * * *